United States Patent [19]
Radys

[11] Patent Number: 5,062,126
[45] Date of Patent: Oct. 29, 1991

[54] HIGH SPEED SYNCHRONOUS COUNTER SYSTEM AND PROCESS WITH LOOK-AHEAD CARRY GENERATING CIRCUIT

[75] Inventor: Raymond G. Radys, Santa Monica, Calif.

[73] Assignee: Hughes Aircraft Company, Los Angeles, Calif.

[21] Appl. No.: 498,509

[22] Filed: Mar. 26, 1990

[51] Int. Cl.$^5$ ............... H03K 21/16; H03K 21/40
[52] U.S. Cl. ........................... 377/51; 377/166; 377/106
[58] Field of Search ............... 377/51, 56, 115, 116, 377/117, 106

[56] References Cited

U.S. PATENT DOCUMENTS

| | | | |
|---|---|---|---|
| 3,631,350 | 12/1971 | Drake | 377/116 |
| 3,943,378 | 3/1976 | Beutler | 377/117 |
| 4,759,043 | 7/1988 | Lewis | 377/116 |
| 4,860,325 | 8/1989 | Aria et al. | 377/51 |
| 4,891,827 | 1/1990 | Slater | 377/116 |

*Primary Examiner*—John S. Heyman
*Attorney, Agent, or Firm*—William J. Streeter; Wanda K. Denson-Low

[57] ABSTRACT

High speed synchronous counters are constrained to operate within certain speeds due to delays inherent in the counter configurations. By utilizing look-ahead carries, that is, producing carry signals in anticipation of when they might be required, much of the delay can be eliminated. Speed performance can be further improved by fashioning the look-ahead carry system from programmable gate arrays, where non-standard logic structures can be created.

18 Claims, 6 Drawing Sheets

Speed D0 + MAX ($D_{IA}, D_{IB}, D_{IC}, D_{ID}, D_{IE}$) + $S_I$

HIGH SPEED SYNCHRONOUS COUNTER SYSTEM AND PROCESS WITH LOOK-AHEAD CARRY GENERATING CIRCUIT

BACKGROUND OF THE INVENTION

1. Field of the Invention

This invention relates to a high speed synchronous counting system and to a process for increasing the speed capabilities of synchronous counters.

2. Description of Related Art

Until now, high speed synchronous counter configurations contained inherent delays which limited the speed at which the counters could operate. Some of these delays have been reduced through the use of a look-ahead carry signal which produces a carry signal one clock pulse before it is needed. However, even employing the one clock early look-ahead carries, the delay has only been reduced to a minimum of one gate delay. Typically, this translates to a guaranteed operating rate of 26 MHz using 70 MHz flip-flops.

High speed counters may be implemented by using gallium arsenide (GaAs) logic or high speed gate arrays. However, these are costly alternatives, compared to using slower, less expensive parts configured to provide increased speed performance.

SUMMARY OF THE INVENTION

This invention relates to a high speed synchronous counter system comprised of a plurality of electronic gates and flip flops interconnected to define a binary counter, means for generating look-ahead carry signals, means for supplying the look-ahead carry signals to desired gates and flip flops at desired times, and means for supplying the clock signals to desired flip flops.

Synchronous counters are comprised of a series of registers configured through the interconnection of electronic gates and flip flops. In operation, each of the registers contain a binary digit, which together represent the number of pulses counted. The speed at which the counters can perform is determined, in large part, by the speed at which the components of the counters can react. Typical delays encountered include gate delays (the time it takes an electronic gate to react), flip flop delays (the time it takes a flip flop to change to the desired output), interconnect delays (the time it takes the signal to travel between components), and set-up delays (the time an input signal to a flip flop must be held while waiting for the clock pulse). Each of these delays encountered in producing a carry signal reduces the speed performance of the counter.

In general, a carry signal is generated when the count contained in a particular group of registers has reached the limit of that group of registers (e.g., each digit is a one so the registers are "full"). The carry signal generated indicates to the next group of registers that one count is to be added. At the next clock pulse, one count is added to the contents of the next group of registers and the first group of registers is reset to zero.

Where the carry signal is not generated until the group of registers is full, the speed of the counter is constrained by the time it takes for the counter to execute the carry and reset the appropriate registers before it can resume counting. Therefore, to the extent that the carry signal can be generated before it is needed, and be applied at precisely the time required, this delay is avoided and the speed performance of the counter can be improved.

Look-ahead carries accomplish this by anticipating the need for the carry signal. In one preferred embodiment, the system begins to generate a look-ahead carry signal two clock pulses before it is required. In another preferred embodiment, the look-ahead carry signal is generated three clock pulses before it is required. As a result, delays inherent in the carry signal generating means occur prior to the time that the carry signal is needed.

BRIEF DESCRIPTION OF THE DRAWINGS

FIGS. 2 and 2a illustrate the configuration in a binary coded decimal (BCD) counter.

FIGS. 4 and 4a illustrate a zero gate delay counter configuration.

DESCRIPTION OF THE PREFERRED EMBODIMENT

In preferred embodiments, a synchronous counter contains N registers, where register $R_0$ contains the least significant bit (LSB) of the count and register $R_N$ contains the most signicant bit (MSB). The first four registers ($R_3$ through $R_0$) are grouped. A carry signal is required when these four registers are full.

In a first preferred embodiment, the counter registers are divided into groups of four, beginning with the register containing the LSB. Therefore, a carry signal is applied to the second group of registers ($R_7$ through $R_4$) when the first group ($R_3$ through $R_0$) is full.

Figure 1:
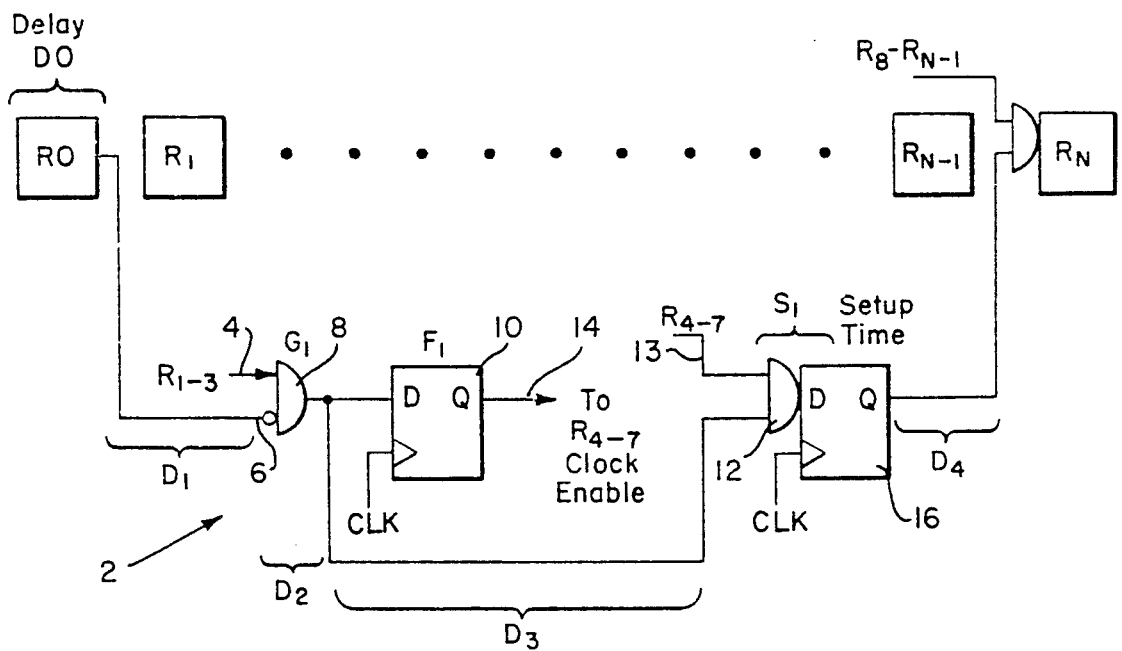
FIG. 1 is a simplified schematic diagram of a first embodiment of an configuration using flip flops and gates, which begins to generate look-ahead carry signals two clock pulses early.

FIG. 1 illustrates a system 2 for a generating look-ahead carry signal two clock pulses before it is required. In the first preferred embodiment, the outputs of registers $R_3$ through $R_1$ 4 and the inverse of the output of register $R_0$ 6 are input to a first AND gate 8. The output of the first AND gate 8 is provided to a first D-type flip flop 10 and a second AND gate 12. In addition to the output of the first AND gate 8, the clock signal of the synchronous counter 13 is also applied to the first D-type flip flop 10.

When the first AND gate 8 goes high (i.e., when registers $R_3,R_2,R_1,R_0$ contain 1,1,1,0, respectively), the output of the first D-type flip flop 10 switches from low to high on the following clock pulse. By applying the output signal from the D-type flip flop 10 to the clock enable inputs of the second group of registers ($R_7$ through $R_4$) 14, one count (the carry) will be added to the contents of the second group of registers, upon the arrival of the next clock pulse. The counter will reset the first group of registers to zero.

In preferred embodiments, carry signals are also required when the subsequent groups of registers become full. For example, a carry signal is required when the first and second groups of registers become full, thereby adding one count (the carry) to a third group of registers.

In the first embodiment, the carry signal for the third group of registers is, as with the carry signal for the second group of registers, generated two clock pulses before it is needed. The outputs of the second group of registers ($R_7$ through $R_4$) 13 are input to a second AND gate 12 along with the output from the first AND gate 8. Thus, when registers $R_3, R_2, R_1, R_0$ contain 1,1,1,0, respectively, and registers $R_7$ through $R_4$ contain all ones, the output of the second AND gate 12 will be high. This signal is input to a second D-type flip flop 16, whose output switches from low to high at the next clock pulse. By applying the output signal from the second D-type flip flop 16 to the clock enable inputs of the third group of registers ($R_{11}$ through $R_8$), one count (the carry) will be added to the contents of the third group of registers upon the arrival of the following clock pulse. The counter will reset the first and second groups of registers to zero.

Figure 2:
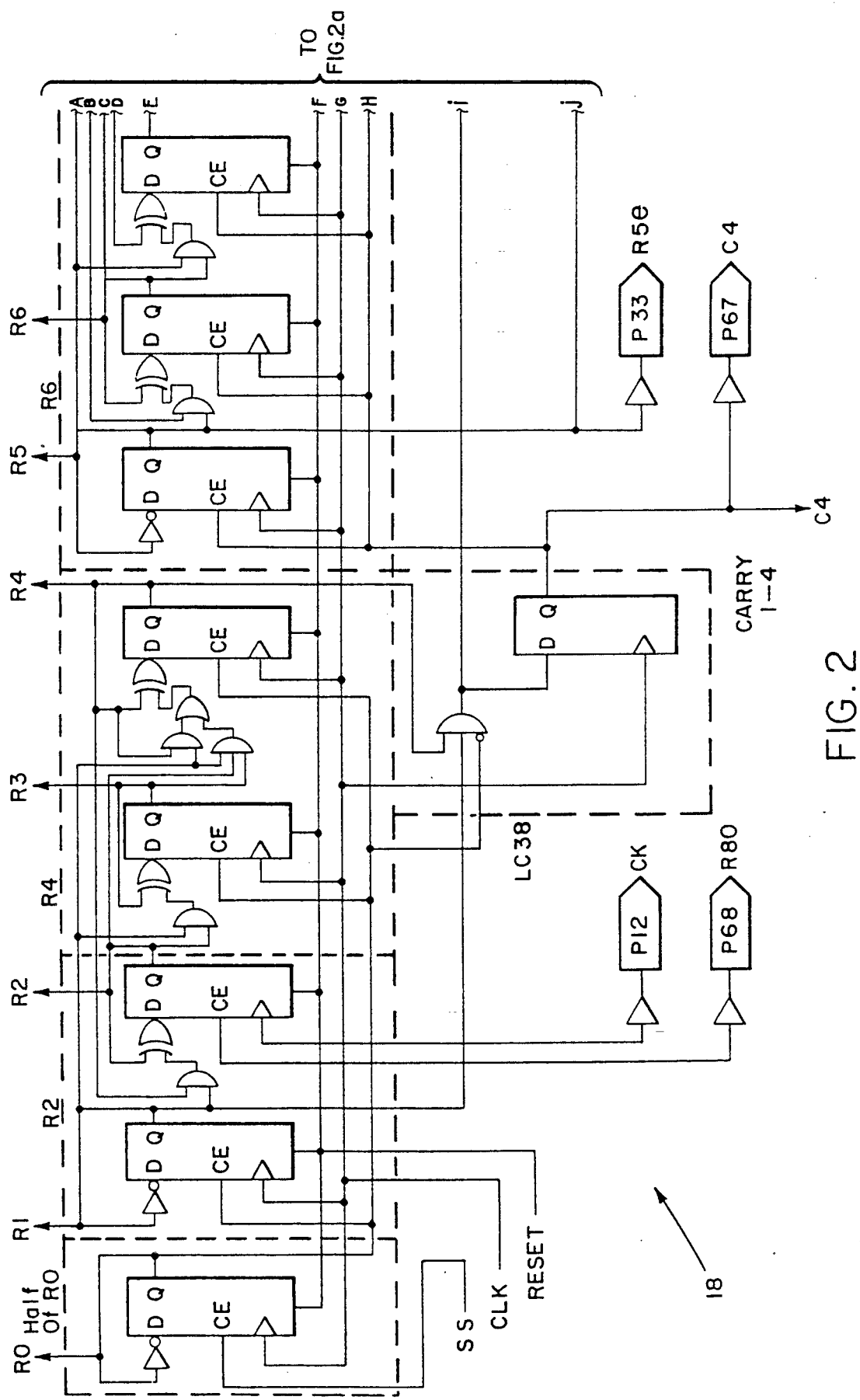
FIGS. 2 and 2a are a complete schematic diagram of the first embodiment, incorporating the look-ahead carry signal generating means shown in FIG. 1.
Figure 2A:
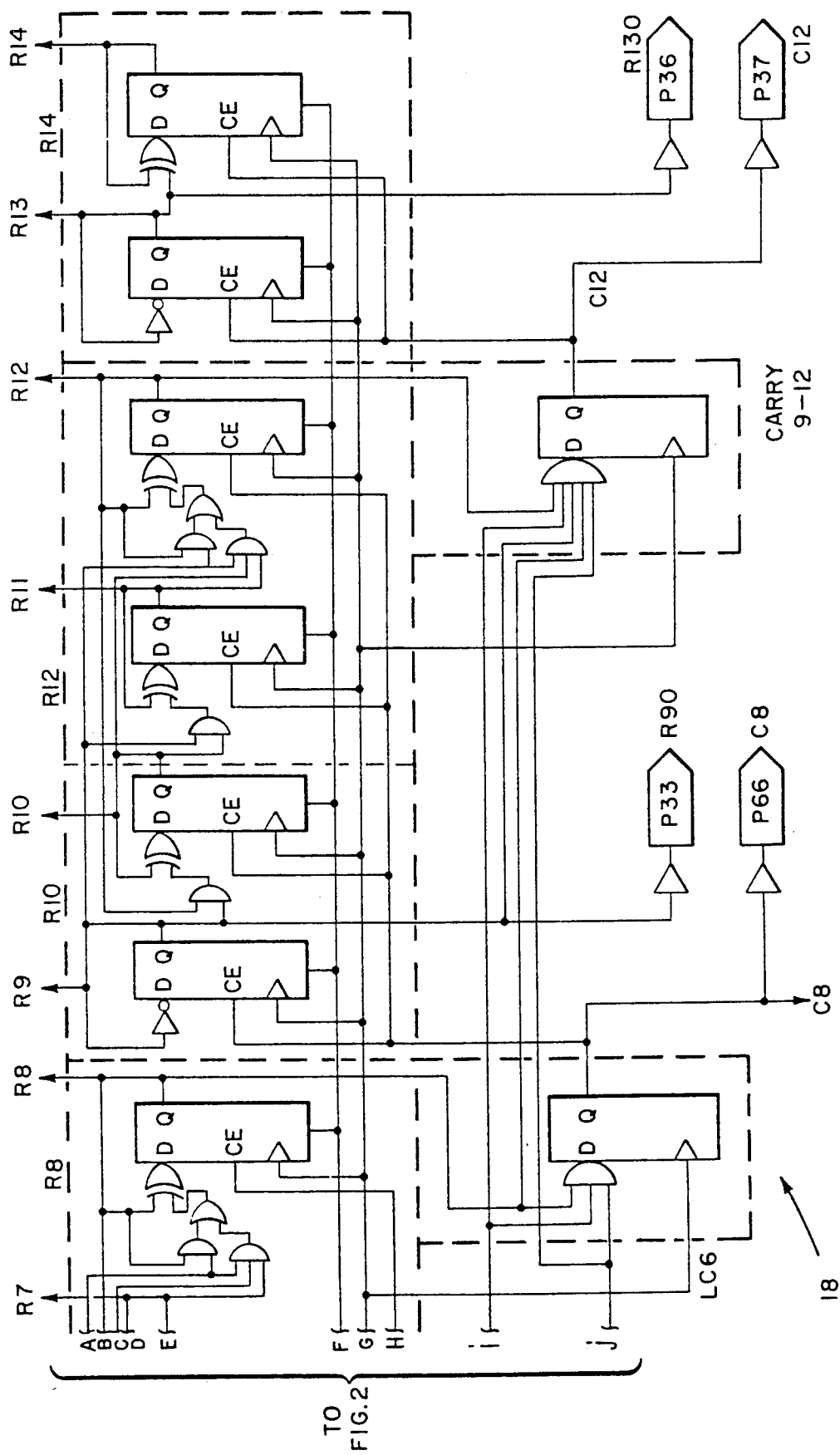

FIGS. 2 and 2a show a complete schematic diagram for a 14-bit synchronous binary coded decimal (BCD) counter 18 utilizing the look-ahead carry created two clock pulses early. It was implemented using a 70 MHz Xilinx Logic Cell Array. The worst case delay through the counter would be 31 ns, yielding a worst case performance of 32 MHz and a nominal measured performance of 53 MHz.

Five component delays comprise the sum total worst case delay of 31 ns in the first preferred embodiment. The first of these delays is the delay inherent in register $R_0$ (worst case, 8 ns); the second delay is the interconnect between register $R_0$ and the first AND gate 8 (worst case, 2 ns); the third delay is the gate delay associated with the first AND gate 8 (worst case, 8 ns); the fourth delay is the interconnect between the output of the first AND gate 8 and the input of the second AND gate 12 (worst case, 5 ns); and the fifth delay is the setup time of the combination of the second AND gate 12 and the second D-type flip flop 16 (worst case, 8). Thus, the total worst case delay of this configuration is 31 ns, translating to a worst case performance of 32 MHz.

In the first preferred embodiment, illustrated in FIGS. 1 and 2 (with 2a), the carry signal was generated two clock pulses before it was needed, thereby eliminating some of the delay in providing the carry signal at the desired time. In a second preferred embodiment, a different configuration generates the look-ahead carry signal three clock pulses before it is needed, thereby eliminating even further the delay in providing the carry signal at the desired time.

Figure 3:
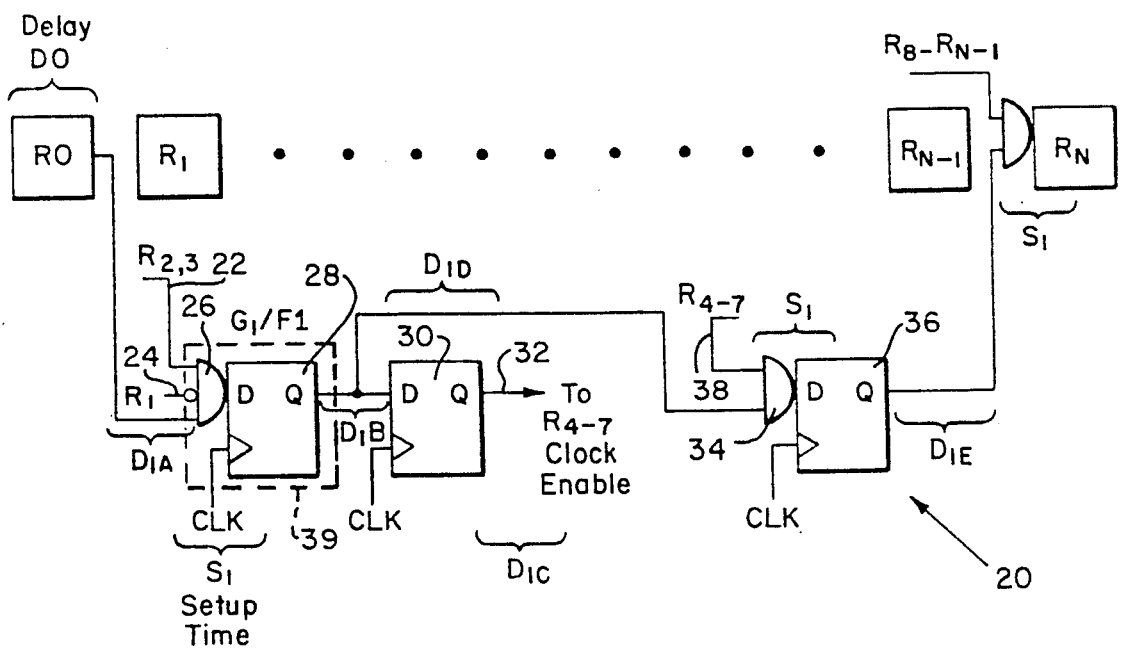
FIG. 3 shows a simplified schematic diagram of a second embodiment, which begins to generate look-ahead carry signals three clock pulses early.
Figure 4:
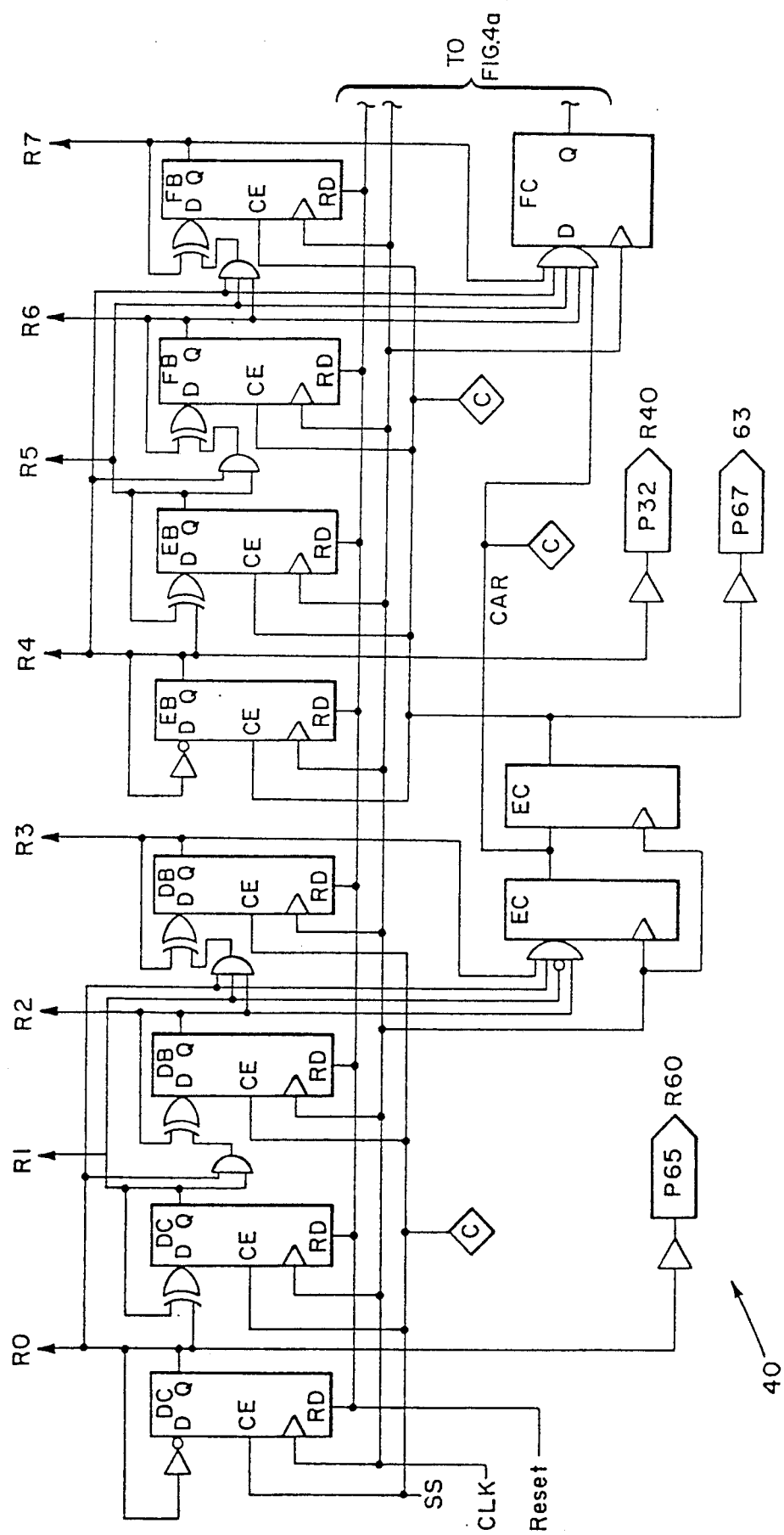
FIGS. 4 and 4a are a complete schematic diagram of the second embodiment, incorporating the look-ahead carry signal generating means shown in FIG. 3. Specifically.

The second preferred embodiment, shown in FIGS. 3 and 4 with 4a, is a configuration 20 wherein the carry signal is generated three clock pulses early. As in the first embodiment, the counter registers are divided into groups of four, beginning with the register containing the LSB. As before, a carry signal is required for the second group of registers ($R_7$ through $R_4$) when the first group ($R_3$ through $R_0$) is full. Likewise, a carry signal is required for the third group of registers ($R_{11}$ through $R_8$) when the first and second groups are full, and so on.

In the second preferred embodiment, the outputs of $R_3$, $R_2$, and $R_0$ 22 and the inverse of the output of register $R_1$ 24 are input to a first AND gate 26. The output of the first AND gate 26 is provided to a first D-type flip flop 28. In addition to the output from the first AND gate 26, the clock signal to the synchronous counter is also supplied to the first D-type flip flop 28. When the first AND gate 26 goes high (i.e., when registers $R_3, R_2, R_1, R_0$ contain 1,1,0,1, respectively), the output of the first D-type flip flop 28 switches from low to high on the following clock pulse.

The output of the first D-type flip flop 28 is provided to a second D-type flip flop 30. In addition to the output from the first D-type flip flop 28, the clock signal to the synchronous counter is also supplied to the the second D-type flip flop 30. Thus, at the following clock pulse, the output 32 of the second D-type flip flop 30 will switch from low to high, at which time the contents of registers $R_3$ through $R_0$ will be full. The output of the second D-type flip flop is applied to the clock enable inputs of a second group of registers ($R_7$ through $R_4$) 32. Therefore, at the next clock pulse, one count (the carry) will be added to the contents of the second group of registers. The counter will reset the first group of registers to zero.

Figure 4A:
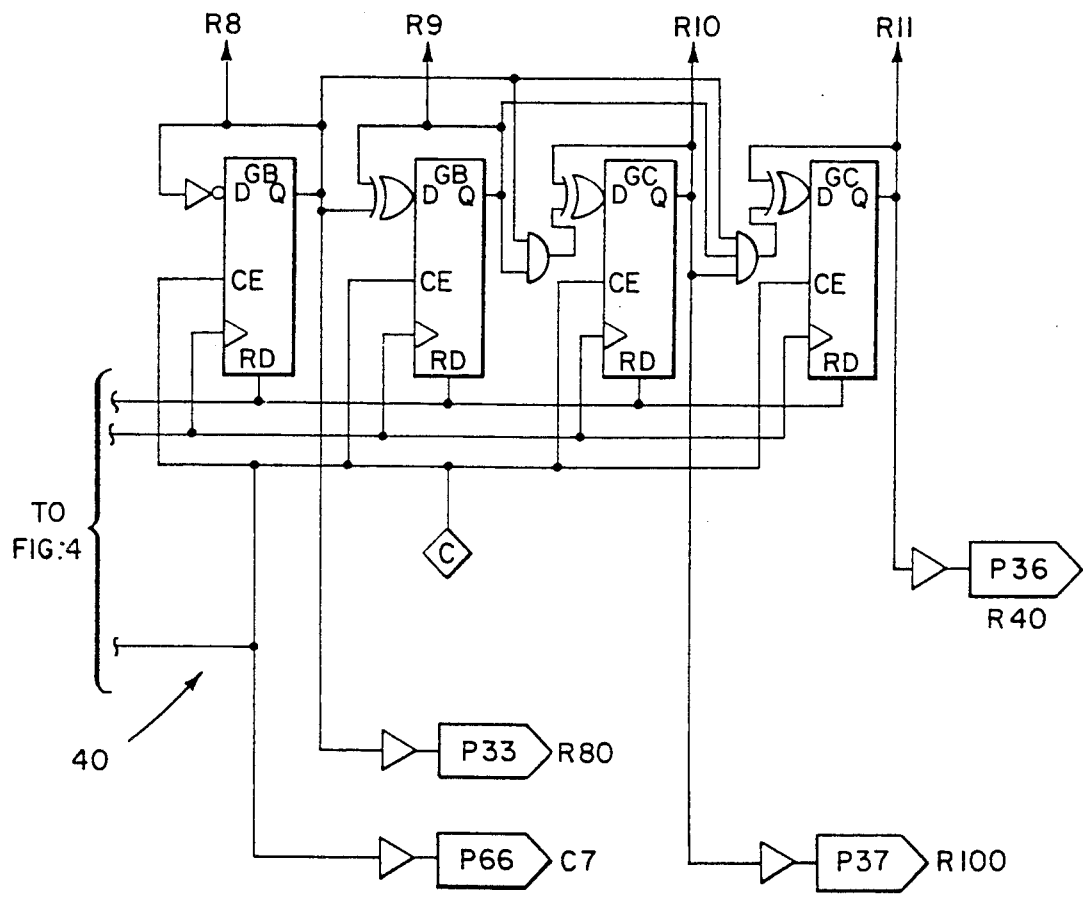

A second AND gate 34, in concert with a third D-type flip flop 36, generates the carry signal to be provided to a third group of registers when registers $R_7$ through $R_0$ are full. The inputs to the second AND gate 34 include the output from the first D-type flip flop 28 and the outputs from the second group of registers, $R_7$ through $R_4$ 38. Thus, when the output from the first D-type flip flop 28 goes high (i.e., the clock pulse after the first AND gate goes high), and registers $R_7$ through $R_4$ contain all ones, the output of the second AND gate 34 will go high. The output of the second AND gate 34 is input to the third D-type flip flop 36. In addition to the output of the second AND gate 34, the clock signal to the synchronous counter is also supplied to the the third D-type flip flop 36. Thus, the output of the third D-type flip flop 36 switches to high at the next clock pulse. By applying the output signal from the third D-type flip flop 36 to the clock enable inputs of the third group of registers ($R_{11}$ through $R_8$), one count (the carry) will be added to the contents of the third group of registers upon the arrival of the following clock pulse. In addition, the first and second groups of registers will be reset to zero. This is depicted in FIGS. 4 and 4a, which show a complete schematic diagram for a 12-bit synchronous binary counter 40 utilizing the look-ahead carry created three clock pulses early.

Also illustrated in FIG. 3 is a third preferred embodiment where the first AND gate 26 and the first D-type flip flop 28 are combined into a single logic structure 39 by utilizing a programmable logic array, such as the Xilinx Logic Cell Array. The worst case delay for this configuration would be 23 ns (versus 31 ns in the first preferred embodiment), yielding a worst case performance of 44 MHz and a nominal measured performance of 82 MHz (versus 32 MHz and 53 Mhz, respectively, in the first preferred embodiment).

Three component delays comprise the sum total worst case delay of 23 ns in the third preferred embodiment. The first of these delays is the delay inherent in register $R_0$ (worst case, 8 ns). The second delay is the greater of five delays, including: 1) the interconnect delay between register $R_0$ and the first AND gate 26 (worst case, 2 ns); 2) the interconnect delay between the first D-type flip flop 28 and the second D-type flip flop 30 (worst case, 1 ns); 3) the interconnect delay between the output of the second D-type flip flop 30 and the clock enable inputs of the second group of registers 32 (worst case, 7 ns); 4) the interconnect delay between the output of the first D-type flip flop 28 and the input of the second AND gate 34 (worst case, 1 ns); and 5) the interconnect delay between the output of the third D-type flip flop 36 and the registers (worst case, 7 ns). The third delay is the setup time of the single logic structure 39 comprising the first AND gate 26 and the first D-type flip flop 28 (worst case, 8). Thus, the total worst case delay of this configuration is 23 ns, translating to a worst case performance of 44 MHz.

Figure 5:
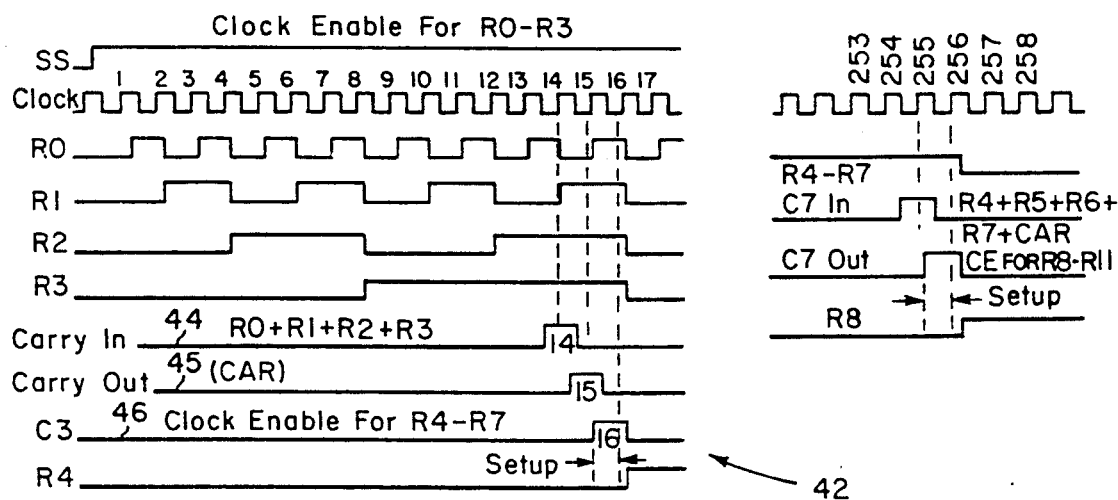
FIG. 5 shows a timing diagram for the second embodiment illustrated in FIGS. 3 and 4 of the zero gate delay counter.

A timing diagram 42 for the second preferred embodiment creating the carry signal three clock pulses early is shown in FIG. 5. The line labeled CARRY IN 44 shows the output of the first AND gate 26. The line labeled CARRY OUT 45 shows the output of the first D-type flip flop 28. The line labeled C3 46 shows the output 32 of the second D-type flip flop 30. In particular, the timing diagram shows the stages of the carry signal generation detailed through clock pulses 14, 15 and 16 (in which the carry signal is applied to the second group of registers) and again through clock pulses 254, 255 and 256 (in which the carry signal is applied to the third group of registers).

Figure 6:
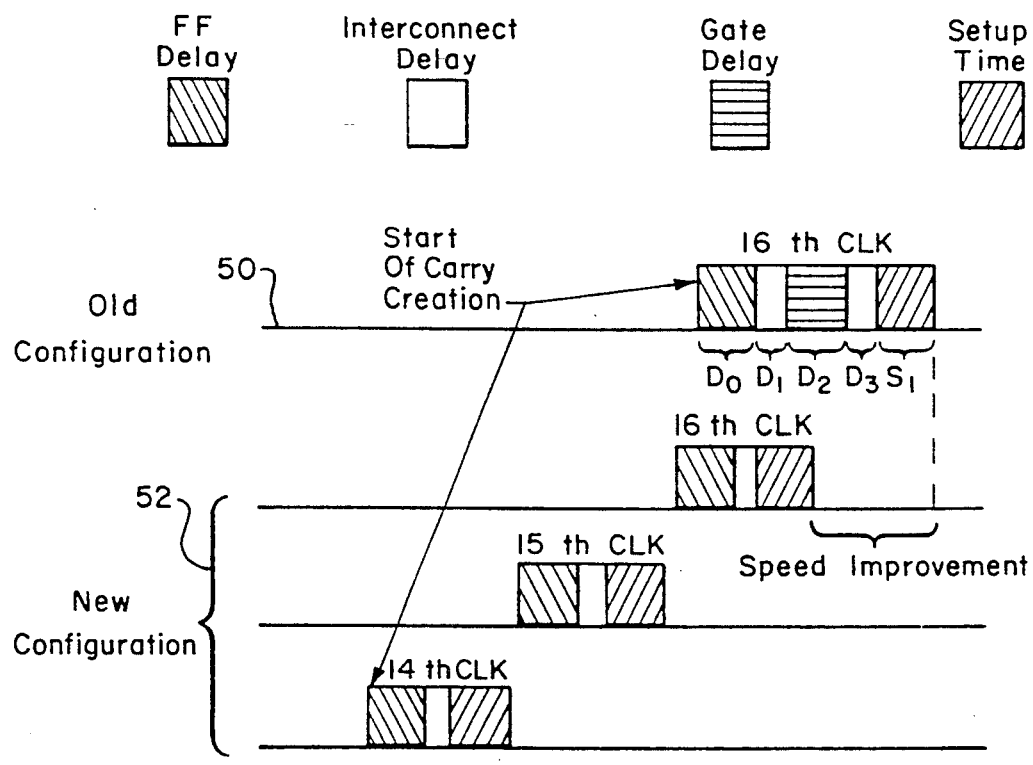
FIG. 6 illustrates the various delays in the system and how they are eliminated in the second embodiment, illustrated in FIGS. 3 and 4.

FIG. 6 illustrates the speed improvement realized by beginning the carry signal generation three clock pulses before it is required The delays under the old wide AND gate configuration, where the carry signal was not generated ahead of time, 50 versus the second preferred embodiment (new configuration), where the carry signal is generated three clock pulses ahead of time, 52 are shown.

While preferred embodiments of the present invention have been described and illustrated, various modifications will be apparent to those skilled in the art and it is intended to include all such modifications and variations within the scope of the appended claims.

What is claimed is:

1. A synchronous counting system, comprising:
   a counter having at least three groups of registers, said registers being defined by a plurality of electronic gates and flip flops;
   look-ahead carry generating means for generating carry signals to be supplied to said second and third groups of registers of said counter at desired times with less than one gate delay;
   means for supplying said carry signals to said desired registers and flip flops at the desired times; and
   means for supplying clock signals, having periodic clock pulses, to said counter and said look-ahead carry generating means.

2. The system of claim 1, wherein said look-ahead carry generating means comprises electronic gates and flip flops, said gates and flip flips being interconnected to produce carry signals at desired times.

3. The system of claim 2 in which said look-ahead carry generating means comprises:
   said first group of registers of said counter;
   a first AND gate in which the inputs to said first AND gate include the outputs from said first group of registers; and
   a first carry flip flop in which the inputs to said first carry flip flop include said clock signal and the output from said first AND gate, wherein said output from said first carry flip flop is coupled to said second group of registers of said counter.

4. The system of claim 3 further comprising a second carry flip flop in which the inputs to said second carry flip flop include said clock signal and the output from said first carry flip flop.

5. The system of claim 3 in which said gates and flip flops are contained on a gate array.

6. The system of claim 5 in which said first carry flip flop and first AND gate are represented by a single logic structure on said gate array.

7. The system of claim 1 wherein said generation of said carry signals begins at least two clock pulses before the time when said carry signals are needed.

8. A synchronous counting method, comprising the steps of:
   interconnecting a plurality of electronic gates and flip flops to define a plurality of registers, in at least three groups, to form a counter;
   generating look-ahead carry signals, said look-ahead carry signals being applied to said second and third groups of registers of said counter at desired times with less than one gate delay; and
   applying a clock signal having periodic clock pulses to said plurality of flip flops to control the times at which said flip flops change state.

9. The method of claim 8, wherein generating said look-ahead carry signals comprises the steps of:
   applying the outputs from said first group of registers of said counter to a first AND gate;
   applying the output from said first AND gate to a first carry flip flop; and
   applying a clock signal to said first carry flip flop, such that when said output from said first AND gate is high and said clock signal goes high, an output from said first carry flip flop will switch from low to high.

10. The method of claim 9, wherein generating said look-ahead carry further comprises the steps of:
    applying said output from said first carry flip flop to a second carry flip flop; and
    applying a clock signal to said second carry flip flop, such that when said output from said first carry flip flop is high and said clock signal goes high, an output from said second carry flip flop will switch from low to high.

11. The method of claim 10, further comprising the step of fashioning said first AND gate and said first carry flip flop from one logic structure on a gate array.

12. The method of claim 8 wherein said generation of said carry signals begins at least two clock pulses before the time when said carry signals are needed.

13. A synchronous counting system, comprising:
    a counter having at least three groups of registers, said registers being defined by a plurality of electronic gates and flip flops;
    look-ahead carry generating means for generating carry signals to be supplied to said second and third groups of registers of said counter at desired times, said generation of said carry signals beginning at least two clock pulses before the time when said carry signals are needed; and
    means for supplying said carry signals to said desired registers at the desired times.

14. The system of claim 13 in which said look-ahead carry generating means comprises:
    said first group of registers of said counter;

a first AND gate in which the inputs to said first AND gate include the outputs from said first group of registers; and a first carry flip flop in which the inputs to said first carry flip flop include said clock signal and the output from said first AND gate, wherein said output from said first carry flip flop is coupled to said second group of registers of said counter.

15. The system of claim 14 in which said first carry flip flop and first AND gate are represented by a single logic structure on said gate array.

16. A synchronous counting method, comprising the steps of:

interconnecting a plurality of electronic gates and flip flops to define a plurality of registers, in at least three groups, to form a counter;

generating look-ahead carry signals, said look-ahead carry signals being applied to said second and third groups of registers at desired times, wherein said generation of said carry signals begins at least two clock pulses before the time when said carry signals are needed; and applying a clock signal to said plurality of flip flops to control the times at which said flip flops change state.

17. The method of claim 16, wherein generating said look-ahead carry signals comprises the steps of:

applying the outputs from said first group of registers of said counter to a first AND gate;

applying the output from said first AND gate to a first carry flip flop; and applying a clock signal to said first carry flip flop, such that when said output from said first AND gate is high and said clock signal goes high, an output from said first carry flip flop will switch from low to high.

18. The method of claim 17, further comprising the step of fashioning said first AND gate and said first carry flip flop from one logic structure on a gate array.

* * * * *